(12) United States Patent
Kim (10) Patent No.: US 8,867,291 B2
(45) Date of Patent: Oct. 21, 2014

(54) SEMICONDUCTOR APPARATUS (75) Inventor: Hyung Soo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 140 days.

(21) Appl. No.: 13/602,140

(22) Filed: Sep. 1, 2012

(65) Prior Publication Data
US 2013/0235682 A1  Sep. 12, 2013

(30) Foreign Application Priority Data

Jan. 10, 2012  (KR) .......................... 10-2012-0002937

(51) Int. Cl.
*G11C 7/12* (2006.01)
*G11C 11/4094* (2006.01)
(52) U.S. Cl.
CPC .............. *G11C 7/12* (2013.01); *G11C 11/4094* (2013.01)
USPC ........................................................ 365/203
(58) Field of Classification Search
CPC ....................................................... G11C 7/12
USPC ....................................................... 365/203
See application file for complete search history.

(56) References Cited

U.S. PATENT DOCUMENTS

| | | | | |
|---|---|---|---|---|
| 5,982,688 A | * | 11/1999 | Han | 365/203 |
| 2010/0165768 A1 | * | 7/2010 | Won | 365/203 |
| 2010/0202226 A1 | * | 8/2010 | Lee | 365/194 |
| 2012/0218846 A1 | * | 8/2012 | Kang | 365/201 |

FOREIGN PATENT DOCUMENTS

| | | |
|---|---|---|
| KR | 10-2003-0056465 A | 7/2003 |
| KR | 10-2009-0099867 A | 9/2009 |

\* cited by examiner

*Primary Examiner* — Hoai V Ho
*Assistant Examiner* — Min Huang
(74) *Attorney, Agent, or Firm* — William Park & Associates Patent Ltd.

(57) ABSTRACT

A semiconductor apparatus including an equalizing unit configured to equalize voltages of a bit line and a bit bar line in response to an equalization signal; a precharge circuit unit configured to supply a voltage to the bit line and the bit bar line in response to first and second precharge signals; and a control unit configured to receive the equalization signal, and generate the equalization signal as the first and second precharge signals according to a control signal.

16 Claims, 6 Drawing Sheets

SEMICONDUCTOR APPARATUS

CROSS-REFERENCES TO RELATED APPLICATION

The present application claims priority under 35 U.S.C. §119(a) to Korean application number 10-2012-0002937, filed on Jan. 10, 2012, in the Korean Intellectual Property Office, which is incorporated herein by reference in its entirety.

BACKGROUND

1. Technical Field

The present invention relates to a semiconductor integrated circuit, and more particularly, to a semiconductor apparatus.

2. Related Art

In general, a semiconductor apparatus inputs and outputs data through word lines and bit lines connected to memory cells.

Figure 1A:
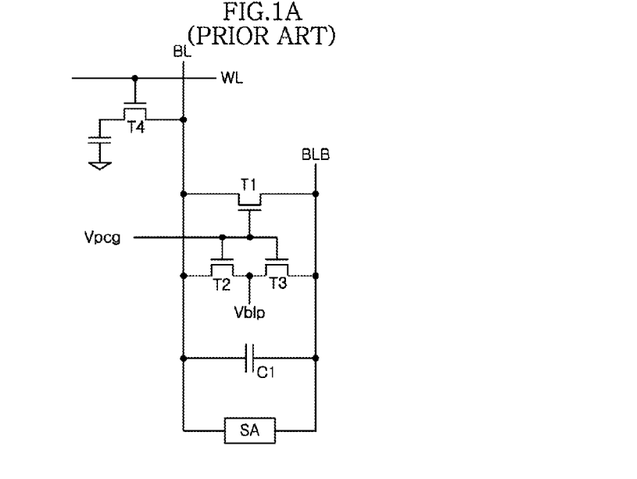
FIG. 1A is a block diagram of a conventional semiconductor apparatus.

FIG. 1A is a block diagram of a conventional semiconductor apparatus.

Referring to FIG. 1A, the configuration of the conventional semiconductor apparatus will be described as follows. First, a bit line BL is precharged to a precharge voltage Vpcg. At this time, in order to remove a voltage difference between the bit line BL connected to a selected memory cell T4 and a bit line unconnected to the memory cell T4 (hereafter, referred to as "bit bar line BLB"), the precharge voltage Vpcg is inputted to first to third transistors T1 to T3 (T1, T2, and T3) to equalize the two bit lines.

Figure 1B:
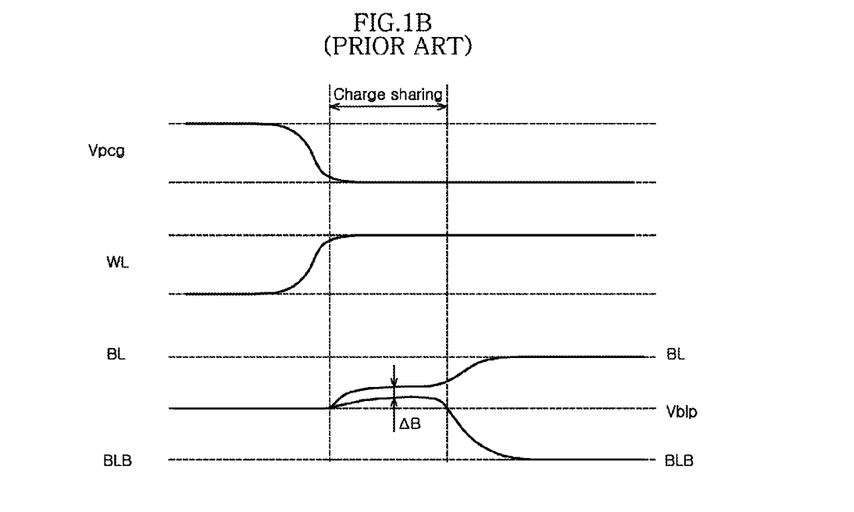
FIG. 1B is an operation timing diagram of the conventional semiconductor apparatus.

FIG. 1B is an operation timing diagram of the conventional semiconductor apparatus.

Referring to FIG. 1B, the operation of the conventional semiconductor apparatus will be described as follows. When a sense amplifier is not used, the precharge signal Vpcg is maintained at a high level such that the memory cell maintains the voltage levels of the bit line BL and the bit bar line BLB at a bit line precharge voltage Vblp. Before a signal inputted to a word line WL becomes a high level, the precharge signal Vpcg is changed to a low level to perform a charge sharing operation. The charge sharing operation causes a voltage difference of the sense amplifier (i.e. SA). At this time, however, the voltage of the bit bar line BLB increases or decreases due to parasitic capacitance C1 between the bit line BL and the bit bar line BLB (i.e., delta B). Therefore, the voltage change of the bit line BLB caused by the parasitic capacitance C1 may reduce a sensing ability of the sense amplifier. Furthermore, due to mismatch between transistors forming the bit line sense amplifier, an error may occur during data output. Accordingly, an offset measuring method for controlling the mismatch of the bit line sense amplifier is needed.

SUMMARY

In an embodiment, a semiconductor apparatus includes: an equalizing unit configured to equalize voltages of a bit line and a bit bar line in response to an equalization signal; a precharge circuit unit configured to supply a voltage to the bit line and the bit bar line in response to first and second precharge signals; and a control unit configured to receive the equalization signal, and generate the equalization signal as the first and second precharge signals according to a control signal.

In an embodiment, a semiconductor apparatus includes: an equalizing unit configured to equalize voltages of a bit line and a bit bar line in response to an equalization signal; a precharge circuit unit configured to supply a voltage to the bit line and the bit bar line in response to first and second precharge signals; and a control unit configured to receive the equalization signal, output the first and second precharge signals according to a control signal, and output the first and second precharge signals at different timings.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to an embodiment of the present invention will be described below with reference to the accompanying drawings through various embodiments.

Figure 2:
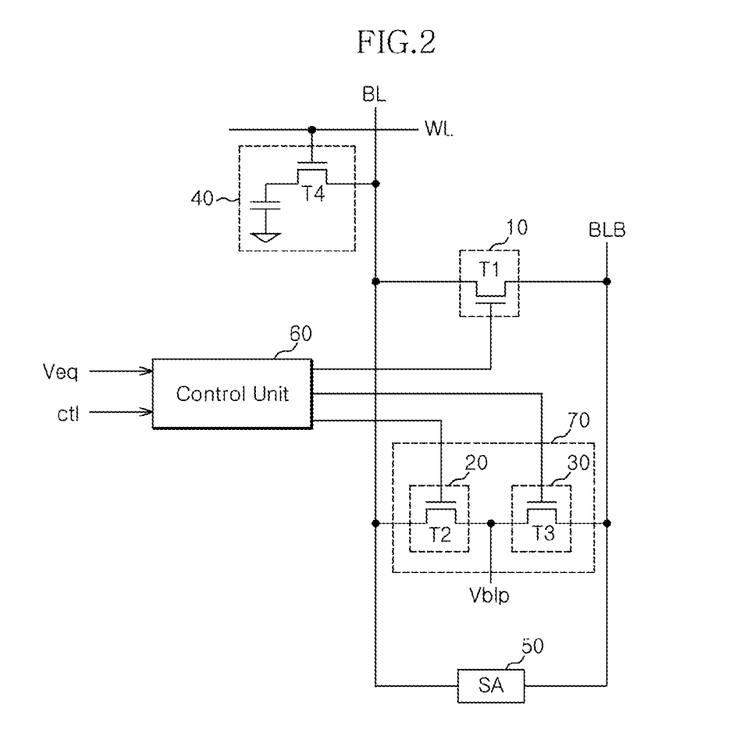
FIG. 2 is a block diagram of a semiconductor apparatus according to an embodiment.

FIG. 2 is a block diagram of a semiconductor apparatus according to an embodiment.

Referring to FIG. 2, the semiconductor apparatus according to an embodiment may include an equalizing unit 10, a memory cell 40, a sense amplifier 50, a control unit 60, and a precharge circuit unit 70.

The equalizing unit 10 may be configured to equalize a bit line BL and a bit bar line BLB according to an equalization signal Veq.

The precharge circuit unit 70 may include a plurality of precharge units. The precharge circuit unit 70 may be configured to supply a precharge voltage Vblp to the bit line BL and the bit bar line BLB according to a plurality of precharge signals.

Figure 3:
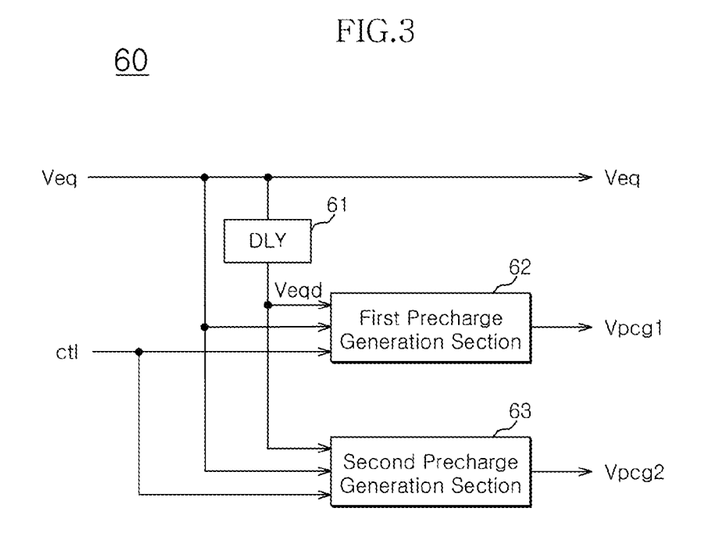
FIG. 3 is a schematic block diagram of the control unit according to an embodiment.

Specifically, the precharge circuit unit 70 may include a first precharge unit 20 and a second precharge unit 30. The precharge circuit unit 70 may be configured to supply a precharge voltage Vblp to the bit line BL and the bit bar line BLB according to a first precharge signal Vpcg1 and a second precharge signal Vpcg2 (as shown in FIG. 3).

The first precharge unit 20 may be connected to the second precharge unit 30, and configured to supply a precharge voltage Vblp to the bit line BL and the bit bar line BLB according to the first precharge signal Vpcg1.

The second precharge unit 30 may be connected to the first precharge unit 20, and configured to supply a precharge voltage Vblp to the bit line BL and the bit bar line BLB according to the second precharge signal Vpcg2.

The memory cell 40 may be connected to the bit line BL and a word line WL, and used to read or write data. The sense amplifier 50 may sense a voltage difference between the bit line BL and the bit bar line BLB and amplifies data.

The control unit 60 may be configured to receive the equalization signal Veq and generate the equalization signal Veq, the first precharge signal Vpcg1, and the second precharge signal Vpcg2 according to a control signal ctl.

The equalizing unit 10, the first precharge unit 20, the second precharge unit 30, and the memory cell 40 may include NMOS transistors T1, T2, T3, and T4, respectively.

The control signal ctl is activated (for example, high voltage logic level) during a normal operation, and deactivated (for example, low voltage logic level) while an offset of the sense amplifier 50 is measured.

FIG. 3 is a schematic block diagram of the control unit according to an embodiment.

Referring to FIG. 3, the control unit 60 according to an embodiment may include a delay section 61, a first precharge signal generation section 62, and a second precharge signal generation section 63.

Specifically, the delay section 61 may be configured to receive the equalization signal Veq, delay the received equalization signal by a predetermined time, and generate the delayed equalization signal Veqd. The first precharge signal generation section 62 (see also FIG. 4) may be configured to selectively output the equalization signal Veq or the delayed equalization signal Veqd according to the control signal ctl and generate the first precharge signal Vpcg1. The second precharge signal generation section 63 (see also FIG. 4) may selectively output the equalization signal Veq or the delayed equalization signal Veqd according the control signal ctl and may generate the second precharge signal Vpgc2.

Figure 4:
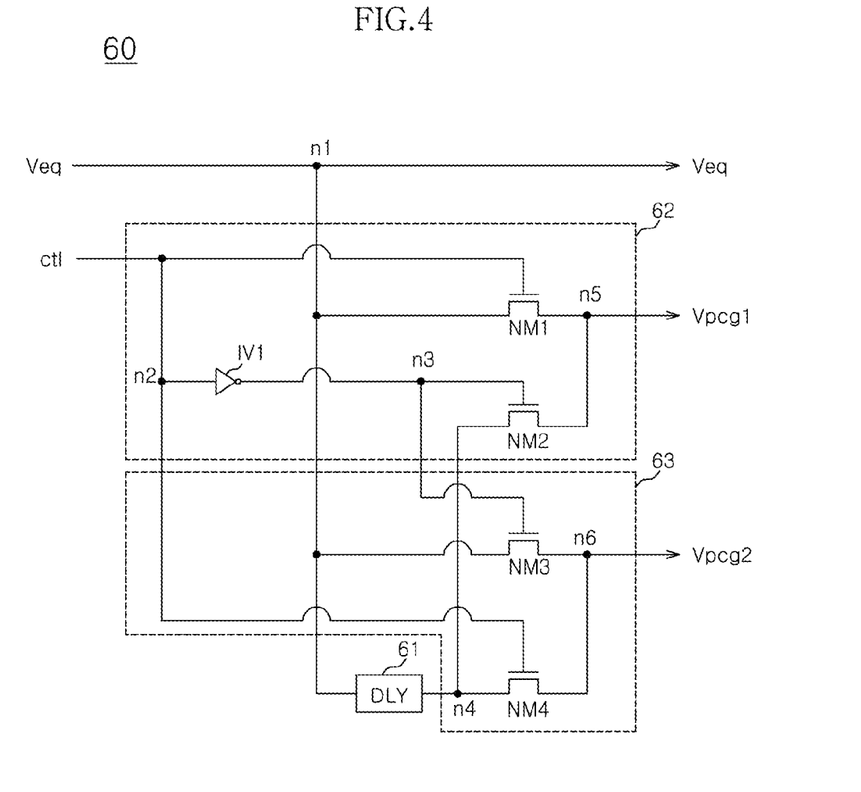
FIG. 4 is an operation timing diagram of the semiconductor apparatus according to an embodiment.

FIG. 4 is a circuit diagram of the control unit 60 according to an embodiment.

The control unit 60 may include first to fourth NMOS transistors NM1 to NM4 (NM1, NM2, NM3, and NM4), a first delay element DLY, and a first inverter IV1.

The control unit 60 may include a first node n1 to receive the equalization signal Veq, a second node n2 to receive the control signal ctl, and a fourth node n4 to receive the delayed equalization signal Veqd (not shown).

The first NMOS transistor NM1 has a gate connected to the second node n2, a drain connected to the first node n1, and a source connected to a fifth node n5.

The second NMOS transistor NM2 has a gate connected to a third node n3, a drain connected to the fourth node n4, and a source connected to the fifth node n5.

The first precharge signal Vpcg1 may be outputted through the fifth node n5.

The third NMOS transistor NM3 has a gate connected to the third node n3, a drain connected to the first node n1, and a source connected to a sixth node n6.

The fourth NMOS transistor NM4 has a gate connected to the second node n2, a drain connected too the fourth node n4, and a source connected to the sixth node n6.

The second precharge signal Vpcg2 may be outputted through the sixth node n6.

The first inverter IV1 may be configured to receive the control signal ctl through the second node n2 and output the inverted control signal ctl to the third node n3.

The delay element DLY may be configured to receive the equalization signal Veq through the first node n1 and generate the delayed equalization signal Veqd after a predetermined time delay.

Referring to FIG. 4, the operation of the control unit 60 according to an embodiment will be described.

The equalization signal Veq may be outputted as the equalization signal Veq through the first node n1.

First, when the control signal ctl is at a high voltage logic level, the first and fourth NMOS transistors NM1 and NM4 are turned on to be driven, and the second and third NMOS transistors NM2 and NM3 are turned off so as not to be driven.

Therefore, when the control signal ctl is at a high voltage logic level, the first precharge signal Vpcg1 generated at the fifth node n5 is generated from the source of the first NMOS transistor NM1, and equal to the equalization signal Veq. The second precharge signal Vpcg2 generated at the sixth node n6 is generated from the source of the fourth NMOS transistor NM4, and is equal to the delayed equalization signal Veq.

Next, when the control signal ctl is at a low voltage logic level, the second and third NMOS transistors NM2 and NM3 are turned on to be driven, and the first and fourth NMOS transistors NM2 and NM4 are turned off so as not to be driven.

Therefore, when the control signal ctl is at a low voltage logic level, the first precharge signal Vpcg1 generated at the fifth node n5 is generated from the source of the second NMOS transistor NM2, and is equal to the delayed equalization signal Veqd. The second precharge signal Vcpg2 generated at the sixth node n6 is generated from the source of the third NMOS transistor NM3, and is equal to the equalization signal Veq.

Figure 5A:
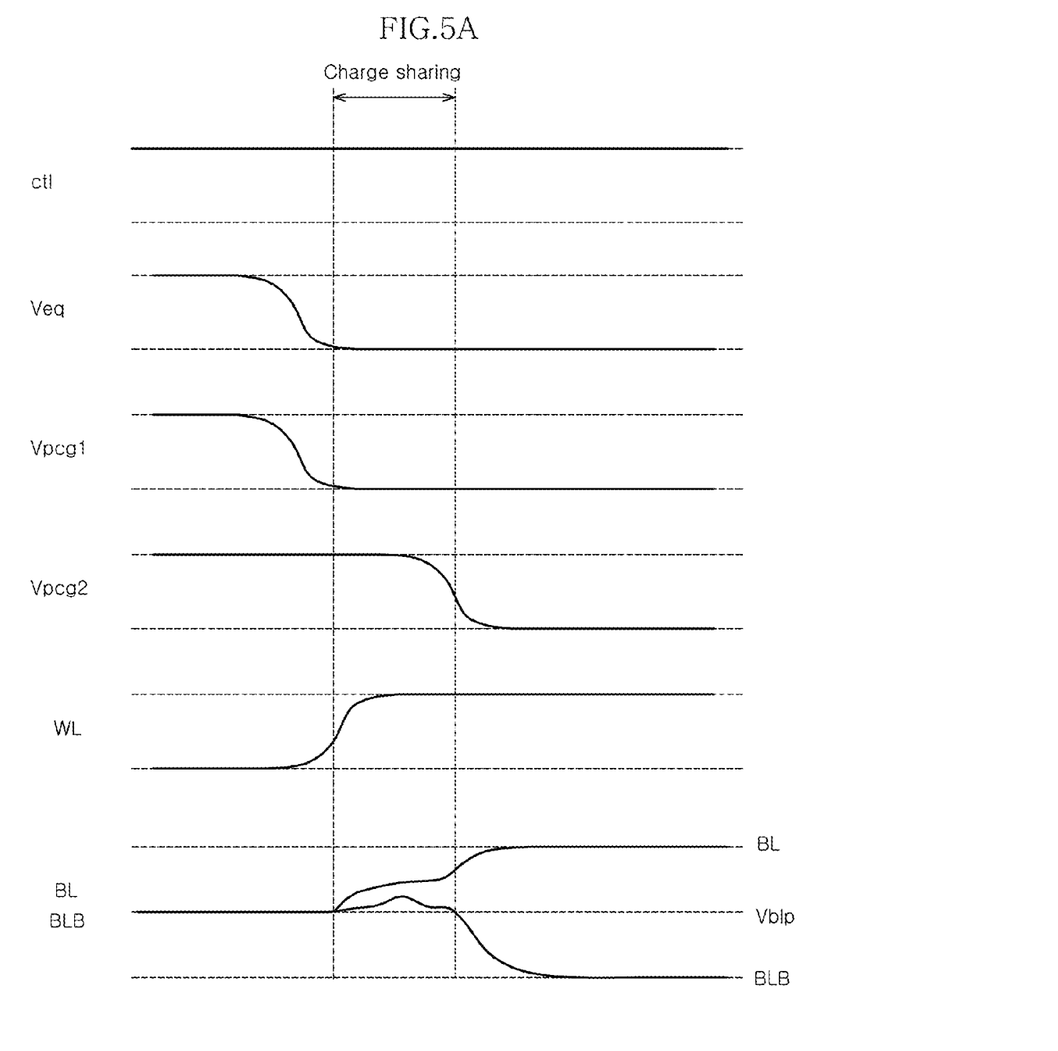
FIG. 5A is an operation timing diagram of the semiconductor apparatus according to an embodiment.

FIG. 5A is an operation timing diagram of the semiconductor apparatus according to an embodiment.

Referring to FIGS. 2 to 4 and 5A, the operation timing of the semiconductor apparatus according to an embodiment will be described.

When the control signal ctl of the control unit 60 is inputted at a high voltage logic level, the control unit 60 may output the equalization signal Veq, the first precharge signal Vpcg1, and the second precharge signal Vpcg2. The first precharge signal Vpcg1 is the equalization signal Veq, and the second precharge signal Vpcg2 is the delayed equalization signal Veqd.

Before a high-level signal is inputted through the word line WL connected to the memory cell 40, the equalization signal Veq and the first precharge signal Vpcg1 transition from a high voltage logic level to a low voltage logic level. During a charge sharing period, the second precharge signal Vpcg2 is maintained at a high voltage logic level to prevent the bit bar line BLB from floating.

During the charge sharing period, the second precharge signal Vpcg2 inputted to the second precharge unit 30 is maintained at a high voltage logic level. In other words, the control unit 60 may input the second precharge signal Vpcg2 to turn on the second precharge unit 30 during the charge sharing period, thereby preventing the bit bar line BLB from floating.

When the charge sharing period is ended, the second precharge signal Vpcg2 transitions to a low voltage logic level. In other words, when the charge sharing period is ended, the control unit 60 inputs the second precharge signal Vcpg2 to turn off the second precharge unit 30.

Comparing FIG. 1B to FIG. 5A, when the second precharge unit 30 is turned on according to the second precharge signal Vpcg2 during the charge sharing period, the voltage of the bit bar line BLB unconnected to the memory cell 40 does not increase due to a parasitic capacitor, but is maintained at the bit line precharge voltage Vblp.

Figure 5B:
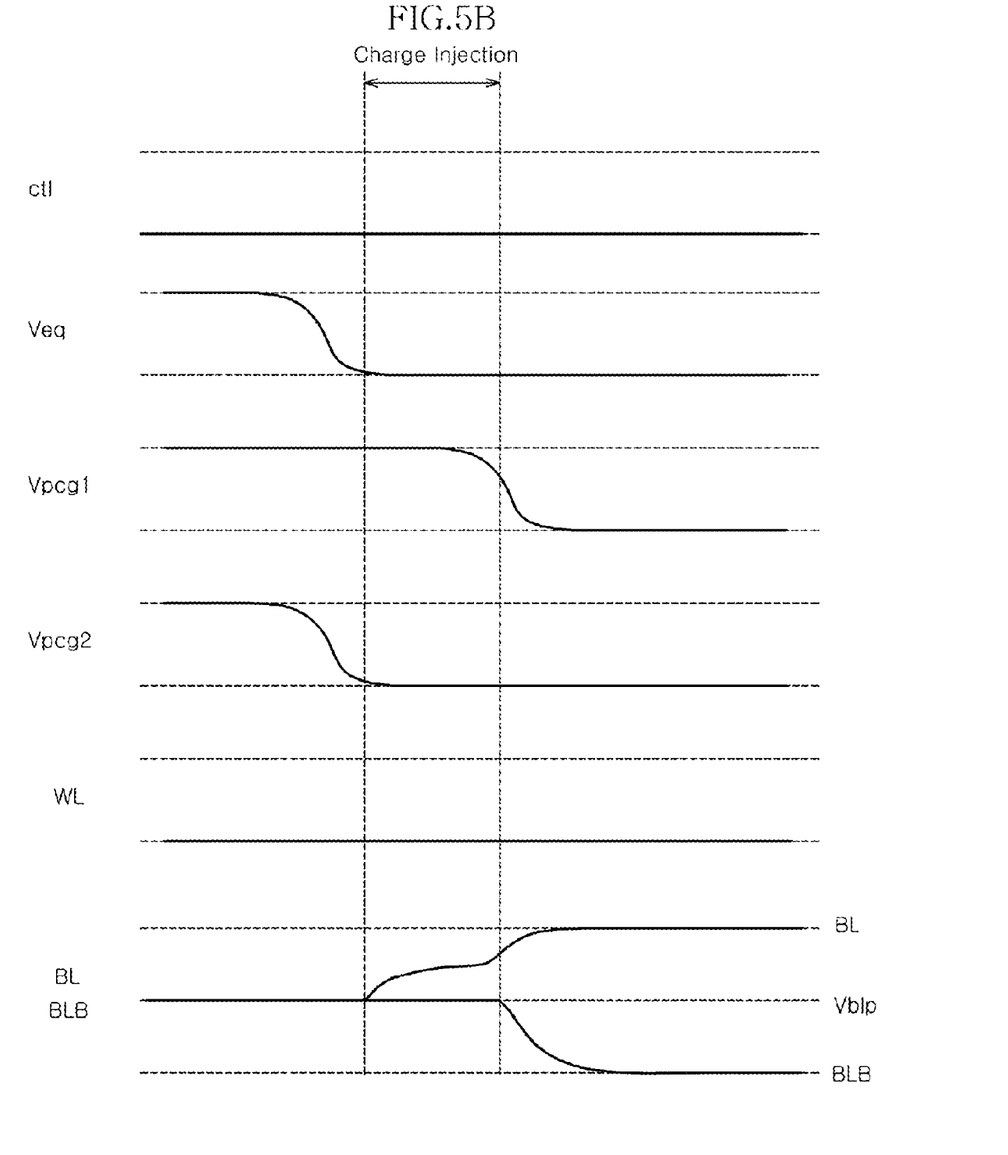
FIG. 5B is an operation timing operation of the semiconductor apparatus according to an embodiment.

FIG. 5B is an operation timing operation of the semiconductor apparatus according to an embodiment.

Referring to FIGS. 2 to 4 and FIG. 5B, the operation timing of the semiconductor apparatus according to an embodiment will be described.

FIG. 5B is a timing diagram for measuring an offset of the sense amplifier 50, when an error occurs during data output due to mismatch of the sense amplifier 50.

When the control signal ctl of the control unit 60 is inputted at a low voltage logic level, the control unit 60 may output the equalization signal Veq, the first precharge signal Vpcg1, and the second precharge signal Vpcg2. The first precharge signal Vpcg1 is the delayed equalization signal Veqd, and the second precharge signal Vpcg2 is the equalization signal Veq.

For offset measurement, the word line WL is not changed to a high voltage logic level, but maintained at a low voltage logic level. When the control signal ctl of the control unit 60 is inputted at a low voltage logic level, the equalization signal Veq and the second precharge Vpcg2 transition from a high voltage logic level to a low voltage logic level, and during a charge injection period, the first precharge signal Vpcg1 is maintained at a high voltage logic level to increase the bit line precharge voltage Vblp or change the bit line precharge voltage Vblp.

The control signal ctl of the control unit 60 may maintain the first precharge signal Vpcg1, inputted to the first precharge unit 30 during the charge injection period, at a high voltage logic level. In other words, when the first precharge unit 30 is turned on, the bit line BL or the bit line precharge voltage Vblp may be changed during the charge injection period.

The sense amplifier 50 may sense data according to the changed bit line precharge voltage Vblp. The offset of the bit line precharge voltage Vblp of the sense amplifier 50 may be measured by sensing whether the value of the data changes or not.

While certain embodiments have been described above, it will be understood to those skilled in the art that the various embodiments described are by way of example only. Accordingly, the semiconductor apparatus described herein should not be limited based on the described embodiments.

What is claimed is:

1. A semiconductor apparatus comprising:
   an equalizing unit configured to equalize voltages of a bit line and a bit bar line in response to an equalization signal;
   a precharge circuit unit configured to supply a voltage to the bit line and the bit bar line in response to first and second precharge signals; and
   a control unit configured to receive the equalization signal a control signal, to generate the first precharge signal equal to the equalizing signal and the second precharge signal obtained by delaying the equalization signal by a predetermined time when the control signal is activated, and to generate the second precharge signal equal to the equalizing signal and the first precharge signal obtained by delaying the equalization signal by a predetermined time when the control signal is deactivated.

2. The semiconductor apparatus according to claim 1, wherein the control unit is configured to receive the equalization signal and generate the first and second precharge signals according to the control signal, wherein one of the first and second precharge signals is obtained by delaying the equalization signal by a predetermined time.

3. The semiconductor apparatus according to claim 1, wherein the control unit comprises:
   a delay section configured to delay the equalization signal and generate a delayed equalization signal;
   a first precharge signal generation section configured to receive the equalization signal and the delayed equalization signal and generate the first precharge signal in response to the control signal; and
   a second precharge signal generation section configured to receive the equalization signal and the delayed equalization signal and generate the second precharge signal in response to the control signal.

4. The semiconductor apparatus according to claim 3, wherein the precharge circuit unit comprises:
   a first precharge unit configured to supply the voltage to the bit line in response to the first precharge signal; and
   a second precharge unit connected to the first precharge unit and configured to supply the voltage to the bit bar line in response to the second precharge signal.

5. The semiconductor apparatus according to claim 1, wherein, during a charge sharing period of a bit line sense amplifier in which voltage logic levels of the equalization signal and the first precharge signal transitions and a word line of a memory cell is activated, the control unit enables the second precharge signal.

6. The semiconductor apparatus according to claim 1, wherein, during a charge injection period in which voltage logic levels of the equalization signal and the second precharge signal transition and a word line of a memory cell is deactivated, the control unit enables the first precharge signal to measure an offset of a bit line sense amplifier.

7. The semiconductor apparatus according to claim 3, wherein the first precharge signal generation section comprises:
   a first NMOS transistor configured to receive the equalization signal and generate the first precharge signal according to the control signal; and
   a second NMOS transistor configured to receive the delayed equalization signal and generate the second precharge signal according to an inverted the control signal.

8. The semiconductor apparatus according to claim 3, wherein the second precharge signal generation section comprises:
   a third NMOS transistor configured to receive the equalization signal and generate the second precharge signal according to an inverted control signal; and
   a fourth NMOS transistor configured to receive the delayed equalization signal and generate the second precharge signal according to the control signal.

9. The semiconductor apparatus according to claim 1, wherein the equalizing unit includes an NMOS transistor having a gate for receiving the equalization signal.

10. A semiconductor apparatus comprising:
    a control unit configured to receive an equalizing signal and a control signal and generate a first precharge signal and a second precharge signal, wherein the first and second precharge signals have different enabling timings each other;
    an equalizing unit configured to equalize voltages of a bit line and a bit bar line in response to an equalization signal;
    a first precharge unit configured to supply the voltage to the bit line in response to the first precharge signal; and
    a second precharge unit connected to the first precharge unit and configured to supply the voltage to the bit bar line in response to the second precharge signal,
    wherein the control unit is configured to generate the first precharge signal equal to the equalizing signal and the second precharge signal obtained by delaying the equalization signal by a predetermined time when the control signal is activated, and generate the second precharge signal equal to the equalizing signal and the first precharge signal obtained by delaying the equalization signal by a predetermined time when the control signal is deactivated.

11. The semiconductor apparatus according to claim 10, wherein the control unit comprises:
    a delay section configured to delay the equalization signal and generate a delayed equalization signal;
    a first precharge signal generation section configured to receive the equalization signal and the delayed equalization signal and generate the first precharge signal in response to the control signal; and a second precharge signal generation section configured to receive the equalization signal and the delayed equalization signal and generate the second precharge signal in response to the control signal.

12. The semiconductor apparatus according to claim 10, wherein, during a charge sharing period of a bit line sense amplifier in which voltage logic levels of the equalization signal and the first precharge signal transition and a word line of a memory cell is activated, the control unit enables the second precharge signal.

13. The semiconductor apparatus according to claim 10, wherein, during a charge injection period in which voltage logic levels of the equalization signal and the second precharge signal transition and a word line of a memory cell is deactivated, the control unit enables the first precharge signal to measure an offset of a bit line sense amplifier.

14. The semiconductor apparatus according to claim 11, wherein the first precharge signal generation section comprises:

a first NMOS transistor configured to receive the equalization signal and generate the first precharge signal according to the control signal; and a second NMOS transistor configured to receive the delayed equalization signal and generate the second precharge signal according to an inverted the control signal.

15. The semiconductor apparatus according to claim 11, wherein the second precharge signal generation section comprises:

a third NMOS transistor configured to receive the equalization signal and generate the second precharge signal according to an inverted control signal; and a fourth NMOS transistor configured to receive the delayed equalization signal and generate the second precharge signal according to the control signal.

16. The semiconductor apparatus according to claim 10, wherein the equalizing unit includes an NMOS transistor having a gate for receiving the equalization signal.

* * * * *